(12) United States Patent
Tang et al.

(10) Patent No.: US 10,135,442 B2
(45) Date of Patent: Nov. 20, 2018

(54) CURRENT-MODE LOGIC CIRCUIT (71) Applicant: MediaTek Singapore Pte. Ltd., Singapore (SG)

(72) Inventors: Yiming Tang, Hefei (CN); Bo Hu, Hefei (CN); Kun Lan, Hefei (CN)

(73) Assignee: MEDIATEK SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/708,430

(22) Filed: Sep. 19, 2017

(65) Prior Publication Data
US 2018/0083624 A1 Mar. 22, 2018

(30) Foreign Application Priority Data
Sep. 22, 2016 (CN) .......................... 2016 1 0841642

(51) Int. Cl.
| | |
|---|---|
| *H03K 19/00* | (2006.01) |
| *H03K 3/356* | (2006.01) |
| *H03K 19/003* | (2006.01) |
| *H03K 19/0175* | (2006.01) |
| *H03K 19/09* | (2006.01) |
| *H04L 25/02* | (2006.01) |

(52) U.S. Cl.
CPC ..... *H03K 19/0005* (2013.01); *H03K 3/35613* (2013.01); *H03K 19/003* (2013.01); *H03K 19/017545* (2013.01); *H03K 19/09* (2013.01); *H04L 25/0276* (2013.01); *H04L 25/0282* (2013.01)

(58) Field of Classification Search
CPC ......... H03K 19/00432; H03K 19/0175; H03K 19/017509; H03K 19/017545; H03K 19/0185; H03K 19/018514; H03K 19/018521; H03K 19/018528
See application file for complete search history.

(56) References Cited

U.S. PATENT DOCUMENTS

| | | | | |
|---|---|---|---|---|
| 7,279,937 B2* | 10/2007 | Aliahmad | ............ | G11C 7/1069 326/115 |
| 7,397,283 B2* | 7/2008 | Chiu | .................... | H04N 5/4403 326/115 |

(Continued)

*Primary Examiner* — Jason M Crawford
(74) *Attorney, Agent, or Firm* — McClure, Qualey & Rodack, LLP (57) ABSTRACT

A current-mode logic circuit is provided. The current-mode logic circuit includes a transmitter module. The transmitter module includes an output impedance circuit, a switch circuit, and a current source. The output impedance circuit provides an adjustable output resistor. The adjustable output resistor includes floating resistors and/or pull-up resistors. The switch circuit is coupled to the output impedance circuit. The switch circuit receives differential input signals, outputs differential output signals, and controls high-low level switching of the differential input signals and the differential output signals according to the adjustable output resistor. The current source is coupled to the output impedance circuit and the switch circuit. The current source provides currents to the output impedance circuit and the switch circuit. The floating resistors are resistors coupled between the differential output signals, and the pull-up resistors are resistors coupled between the differential output signals and a power source.

12 Claims, 5 Drawing Sheets

(56) References Cited

U.S. PATENT DOCUMENTS

| | | | |
|---|---|---|---|
| 7,573,299 B2* | 8/2009 | Watarai | H04L 25/0276 |
| | | | 326/82 |
| 7,598,779 B1* | 10/2009 | Wang | H03K 19/018528 |
| | | | 327/108 |
| 7,808,269 B2* | 10/2010 | Matsudera | H03F 1/56 |
| | | | 326/115 |
| 8,217,682 B1* | 7/2012 | Starr | H03K 19/018528 |
| | | | 326/83 |
| 9,325,316 B1* | 4/2016 | Abou-El-Sonoun | |
| | | | H03K 19/018514 |
| 2003/0085737 A1* | 5/2003 | Tinsley | H03K 19/017527 |
| | | | 326/86 |
| 2004/0246026 A1* | 12/2004 | Wang | H03K 19/018585 |
| | | | 326/86 |
| 2005/0248396 A1* | 11/2005 | Caresosa | H03F 3/45188 |
| | | | 327/563 |
| 2005/0285629 A1* | 12/2005 | Hein | H03K 19/018585 |
| | | | 326/115 |
| 2009/0174439 A1* | 7/2009 | Luo | H03K 19/018528 |
| | | | 327/108 |
| 2009/0195288 A1* | 8/2009 | Chao | G06F 13/4072 |
| | | | 327/321 |
| 2012/0326745 A1* | 12/2012 | Kothandaraman | |
| | | | H03K 19/018528 |
| | | | 326/30 |
| 2013/0214843 A1* | 8/2013 | Ha | H03K 19/018514 |
| | | | 327/333 |
| 2015/0333743 A1* | 11/2015 | Singh | H03K 19/018514 |
| | | | 327/299 |
| 2016/0173098 A1* | 6/2016 | Jaffari | H03K 19/018528 |
| | | | 326/83 |

* cited by examiner

CURRENT-MODE LOGIC CIRCUIT

CROSS REFERENCE TO RELATED APPLICATIONS

This Application claims priority of China Patent Application No. 201610841642.3, filed on Sep. 22, 2016, the entirety of which is incorporated by reference herein.

BACKGROUND OF THE INVENTION

Field of the Invention

The invention relates to high-speed transmission, and more particularly, to a current-mode logic circuit.

Description of the Related Art

With the development of semiconductor technology, the operating frequencies of circuits are continuously increasing, especially in cases related to high-speed transmission, wherein when speeds can reach 10 GHz or above, the operating speeds of CMOS logic-based unit circuits will be limited. In high-speed transmission, current-mode logic (CML) circuits are usually used to replace regular CMOS logic circuits.

According to current technology, since different high-speed signals, such as high-speed data signals of a display port (DP), a high definition multimedia interface (HDMI), a mobile high-definition link (MHL), and a universal serial bus (USB), have different requirements for certain parameters, such as a common-mode voltage of differential output signals, a current consumed by a transmitter terminal, and so on. During transmission processes, the current CIVIL circuits with fixed parameters are only suitable for one specific application, one CML circuit cannot be flexibly applied to various applications.

Thus, how to make common-mode current and consumed current adjustable is an important issue to be solved in order to achieve the purpose of flexibly applying one CML in various applications.

BRIEF SUMMARY OF THE INVENTION

Thus, the present invention provides a current-mode logic circuit.

An exemplary embodiment of a current-mode logic circuit is provided. The current-mode logic circuit comprises a transmitter module. The transmitter module comprises an output impedance circuit, a switch circuit, and a current source. The output impedance circuit provides an adjustable output resistor. The adjustable output resistor comprises floating resistors and/or pull-up resistors. The switch circuit is coupled to the output impedance circuit. The switch circuit receives differential input signals, outputs differential output signals, and controls high-low level switching of the differential input signals and the differential output signals according to the adjustable output resistor. The current source is coupled to the output impedance circuit and the switch circuit. The current source provides currents to the output impedance circuit and the switch circuit. The floating resistors are resistors coupled between the differential output signals, and the pull-up resistors are resistors coupled between the differential output signals and a power source.

According to the embodiment provided by the present invention, the current-mode logic circuit controls high-low level switching of the differential input signals and the differential output signals according to the adjustable output resistor output from the output impedance circuit, thereby making the common voltage of the differential output signals and the current consumed by the transmitter module adjustable. Thus, the current-mode logic circuit can be flexibly applied in various high-speed signal transmission applications.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Certain terms are used throughout the specification and following claims to refer to particular components. As one skilled in the art will appreciate, manufacturers may refer to a component by different names. The specification and following claims do not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if a first device is coupled to a second device, that connection may be through a direct electrical connection, or through an indirect electrical connection via other devices or connections.

To better understand the technical aspects of the present invention, the following embodiments of the invention will be described in detail by referring to the drawings.

Figure 1:
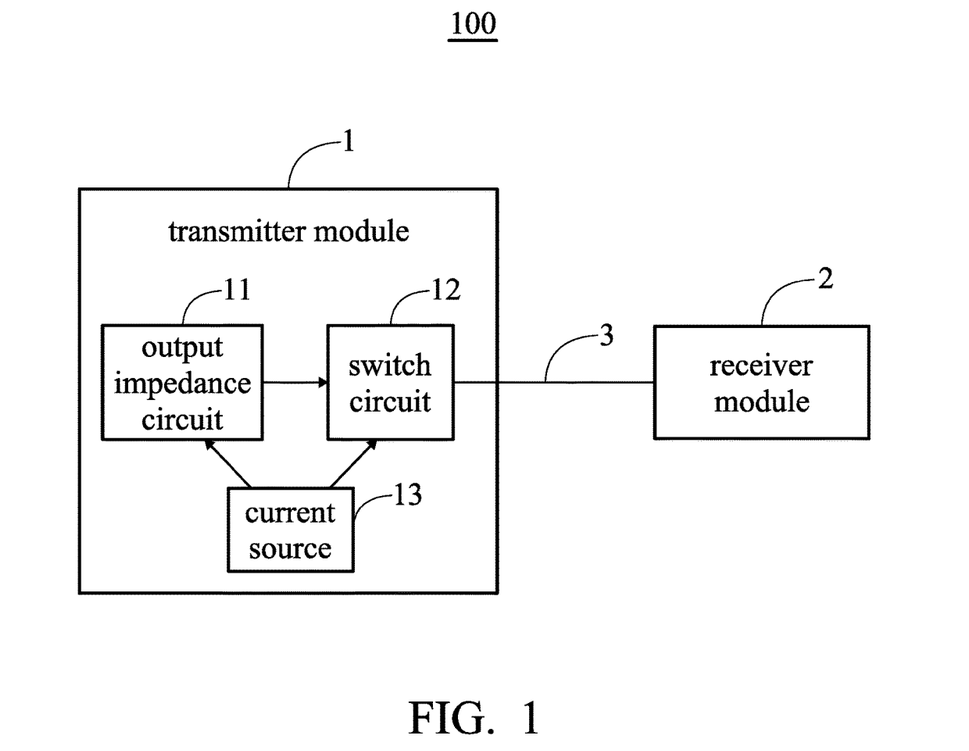
FIG. 1 is a schematic diagram showing a structure of a current-mode logic circuit according to a first embodiment.

FIG. 1 is a schematic diagram showing a structure of a current-mode logic circuit according to a first embodiment. As shown in FIG. 1, a current-mode logic circuit 100 comprises a transmitter module 1 and a receiver module 2.

In the embodiment, the transmitter module 1 and the receiver module 2 are disposed in different devices. The transmitter module 1 transmits differential signals to the receiver module 2 through a connection line 3.

Specifically, the transmitter module 1 comprises an output impedance circuit 11, a switch circuit 12, and a current source 13.

The output impedance circuit 11 is coupled to provide an adjustable output resistor including floating resistors and/or pull-up resistors.

The switch circuit 12 is coupled to the output impedance circuit 11 and the receiver module 2. The switching circuit 12 receives differential input signals, outputs differential output signals to the receiver module 2, and controls high-low level switching of the differential input signals and the differential output signals according to the adjustable output resistor output from the output impedance circuit 11.

The current source 13 is coupled to the output impedance circuit 11 and the switch circuit 12. The current source 13 provides currents to the output impedance circuit 11 and the switch circuit 12.

The floating resistors are resistors coupled between the differential output signals. The pull-up resistors are resistors coupled between the differential output signals and a power source.

In the embodiment above, the current-mode logic circuit controls high-low level switching of the differential input signals and the differential output signals according to the adjustable output resistor output from the output impedance circuit, thereby making the common voltage of the differential output signals and the current consumed by the transmitter module adjustable. Thus, the current-mode logic circuit can be flexibly applied to various high-speed signal transmission applications.

Figure 2:
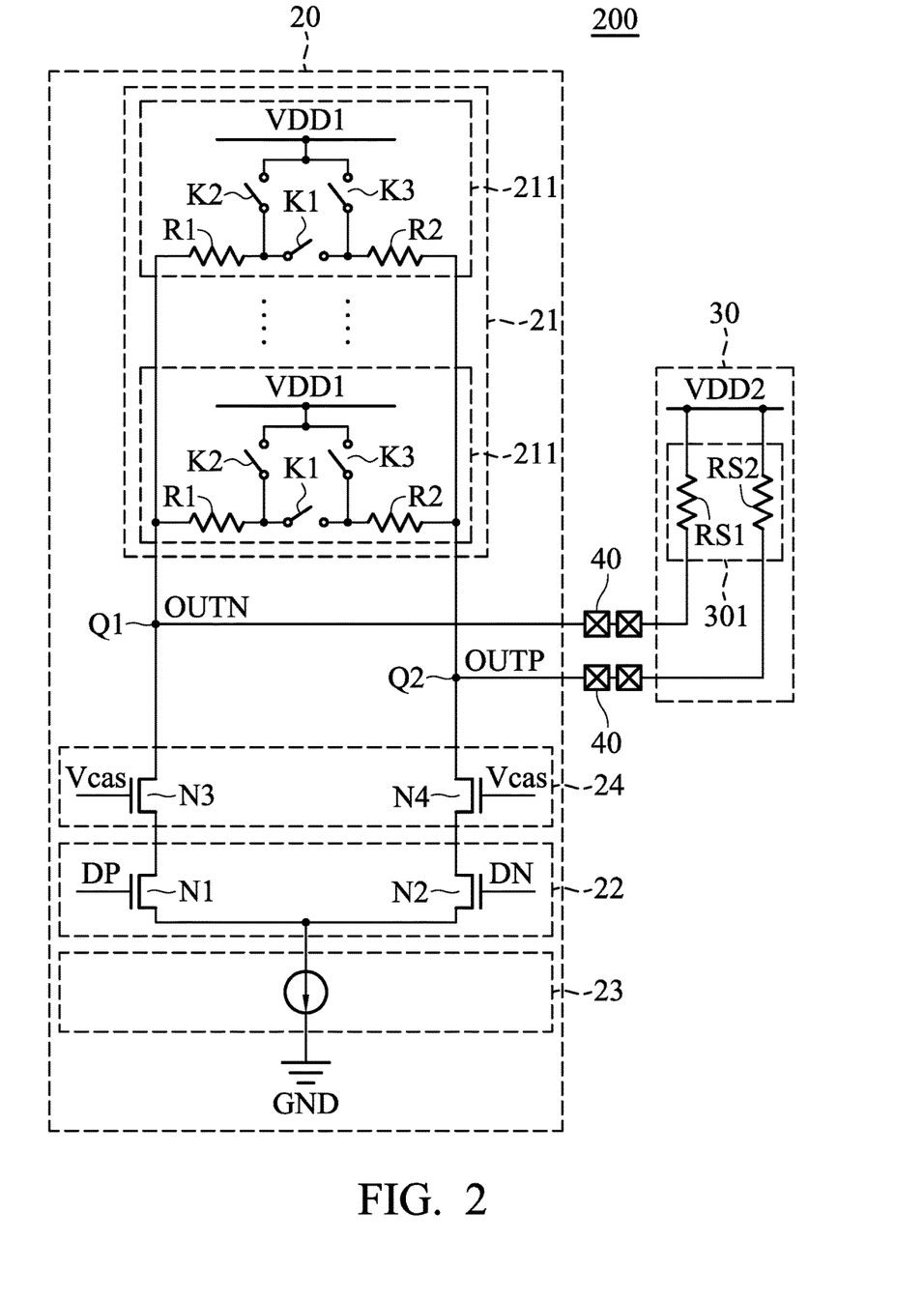
FIG. 2 is a schematic diagram showing a circuit principle of a current-mode logic circuit according to a second embodiment.

FIG. 2 is a schematic diagram showing a circuit principle of a current-mode logic circuit according to a second embodiment. As shown in FIG. 2, a current-mode logic circuit 200 comprises a transmitter module 20 and a receiver module 30.

In the embodiment, the transmitter module 20 and the receiver module 30 are disposed in different devices. The transmitter module 20 transmits differential signals OUTP and OUTN to the receiver module 30 through a connection line 40.

The transmitter module 20 comprises an output impedance circuit 21, a switching circuit 22, and a current source 23. The output impedance circuit 21 is coupled to provide an adjustable output resistor including floating resistors and/or pull-up resistors. The switch circuit 22 receives differential input signals DP and DN, outputs the differential output signals OUTP and OUTN, and controls high-low level switching of the differential input signals DP and DN and the differential output signals OUTP and OUTN according to the adjustable output resistor. The current source 23 provides currents to the output impedance circuit 21 and the switch circuit 22.

Specifically, the output impedance circuit 21 comprises a plurality of output impedance sub-circuits 221 which are coupled in parallel. Each output impedance sub-circuit 211 comprises a first resistor R1, a second resistor R2, a first switch K1, a second switch K2, and a third switch K3. Terminals of all the first resistors R1 on one side are coupled together at a first common terminal Q1. Terminals of all the second resistors R2 on one side are coupled together at a second common terminal Q2. For each output impedance sub-circuit 211, the other terminal of the first resistor R1 is coupled to one terminal of the first switch K1 and one terminal of the second switch K2, the other terminal of the first switch K1 is coupled to the other terminal of the second resistor R2 and one terminal of the third switch K3, and the other terminal of the second switch K2 is coupled to the other terminal of the third switch K3 and then coupled to a first power source VDD1.

The switch circuit 22 comprises a first transistor N1 and a second transistor N2. Gates of the first transistor N1 and the second transistor N2 receive differential input signals DP and DN respectively. Drains of the first transistor N1 and the second transistor N2 are coupled to the first common node Q1 and the second common node Q2 respectively. Sources of the first transistor N1 and the second transistor N2 are coupled together and then coupled to the positive terminal of the current source 23. The negative terminal of the current source 23 is coupled to the ground.

Preferably, the transmitter module 20 further comprises a protection circuit 24 coupled between the output impedance circuit 21 and the switch circuit 22. The protection circuit 24 comprises a third transistor N3 and a fourth transistor N4. Gates of the third transistor N3 and the fourth transistor N4 receive a control signal Vcas. Sources of the third transistor N3 and the fourth transistor N4 are coupled to the drains of the first transistor N1 and the second transistor N2 respectively. Drains of the third transistor N3 and the fourth transistor N4 are coupled to the first common node Q1 and the second common node Q2 respectively.

The first common node Q1 and the second common node Q2 are coupled to one terminal of the connection line 40 for outputting the differential output signals OUTP and OUTN.

Specifically, the receiver module 30 comprises an input impedance circuit 301. The input impedance circuit 301 provides an input resistor. The input impedance circuit 301 comprises a first input resistor RS1 and a second input resistor RS2. One terminal of the first input resistor RS1 and one terminal of the second input resistor RS2 are coupled together and then coupled to the second power source VDD2. The other terminal of the first input resistor RS1 and the other terminal of the second input resistor RS2 are coupled to the other terminal of the connection line 40 to receive the differential output signals OUTP and OUTN respectively.

In the embodiment, according to the different operation states of the first switch K1, the second switch K2, and the third switch K3 in each output impedance sub-circuits 221, the transmitter module 20 can operate in three different operation modes.

When the first switch K1 of each output impedance sub-circuit 221 is turned on and the second switch K2 and the third switch K3 thereof are turned off, the output resistor provided by the output impedance circuit 21 may be floating resistors, and the transmitter module 20 operates in a first operation mode.

Figure 3:
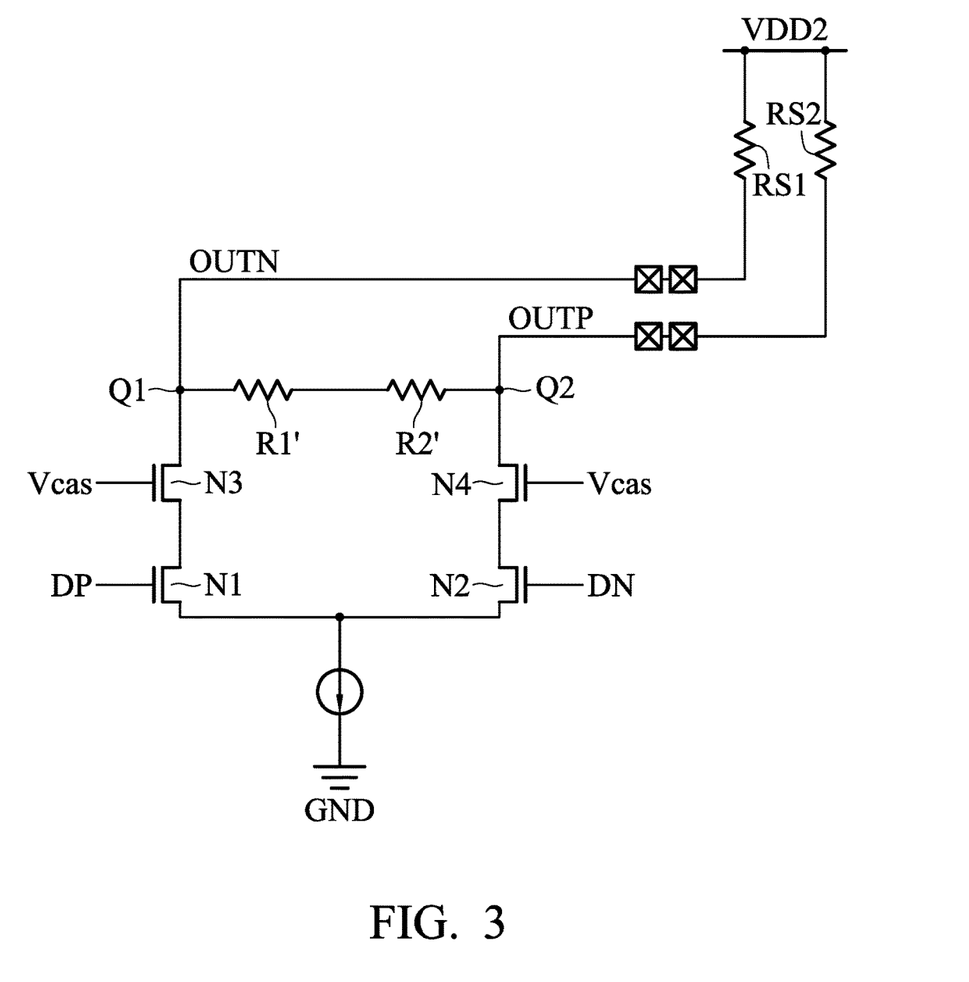
FIG. 3 is a schematic diagram showing an equivalent circuit when the transmitter module shown in FIG. 2 operates in a first operation mode.

Referring to FIG. 3, FIG. 3 is a schematic diagram showing an equivalent circuit when the transmitter module shown in FIG. 2 operates in the first operation mode. As shown in FIG. 3, the first floating resistor R1' and the second floating resistor R2' are the corresponding equivalent resistors of the output impedance circuit 21.

One terminal of the first floating resistor R1' is coupled to one terminal of the second floating resistor R2'. The other terminal of the first floating resistor R1' and the other terminal of the second floating resistor R2' are coupled to the first common node Q1 and the second common node Q2 respectively.

When the transmitter module 20 operates in the first operation mode, if the resistance of the first input resistor RS1 is equal to the resistance of the second input resistor RS2 and the resistance of the first resistor R1 is equal to the resistance of the second resistor R2 (that is, the resistance of the first floating resistor R1' is equal to the resistance of the second floating resistor R2'), the common-mode voltage of the differential output signals OUTP and OUTN generated by the transmitter module 20 can be calculated using the following equations.

$$V'_H = AVDD_{sink} - \frac{R_{sink}}{2R_{sink} + 2R_{source}} * I_{DRV} * R_{sink}$$

$$V'_L = AVDD_{sink} - \frac{R_{sink}}{2R_{sink} + 2R_{source}} * I_{DRV} * R_{sink} -$$

$$\frac{R_{sink}}{2R_{sink} + 2R_{source}} * I_{DRV} * 2R_{source}$$

$$V'_{CM} = 0.5 * (V_H + V_L)$$

$V'_H$ is the high level of the differential output signals in the first operation mode, $V'_L$ is the low level of the differential output signals in the first operation mode, $V'_{CM}$ is the common-mode voltage of the differential output signals in the first operation mode, $AVDD_{sin\_k}$ is the voltage provided by the second power source VDD2, $R_{sin\_k}$ is the resistance of the first input resistor RS1, $I_{DRV}$ is the current value provided by the current source, and $R_{source}$ is the resistance of the first floating resistor R1' which is equal to 1/N of the resistance of the first resistor R1, wherein N is the number of output impedance sub-circuits.

For example, when $AVDD_{sin\_k}$=3.3V, $R_{source}$=$R_{sin\_k}$=50 ohm, and $I_{DRV}$=20 mA:

$V'_H$=3.05V, $V'_L$=2.55V, and $V'_{CM}$=2.8V.

In other words, when the voltage provided by the second power source VDD2 is 3.3V, the resistance of the first input resistor R1 and the resistance of the second resistor R are 50Ω, the resistance of the first floating resistor R1' and the resistance of the second floating resistor R' are 50Ω, and current value provided by the current source is 20 mA, then the high level of the differential output signals OUTP and OUTN is 3.05V, the low level thereof is 2.55V, and the common-mode voltage thereof is 2.8V.

Moreover, when the transmitter module 20 operates in the first operation mode, the current I'$_{source}$ consumed by the transmitter module 20 is equal to zero.

When the first switch K1 of each output impedance sub-circuit 221 is turned off and the second switch K2 and the third switch K3 thereof are turned on, the output resistor provided by the output impedance circuit 21 comprises pull-up resistors, and the transmitter module 20 operates in a second operation mode.

Figure 4:
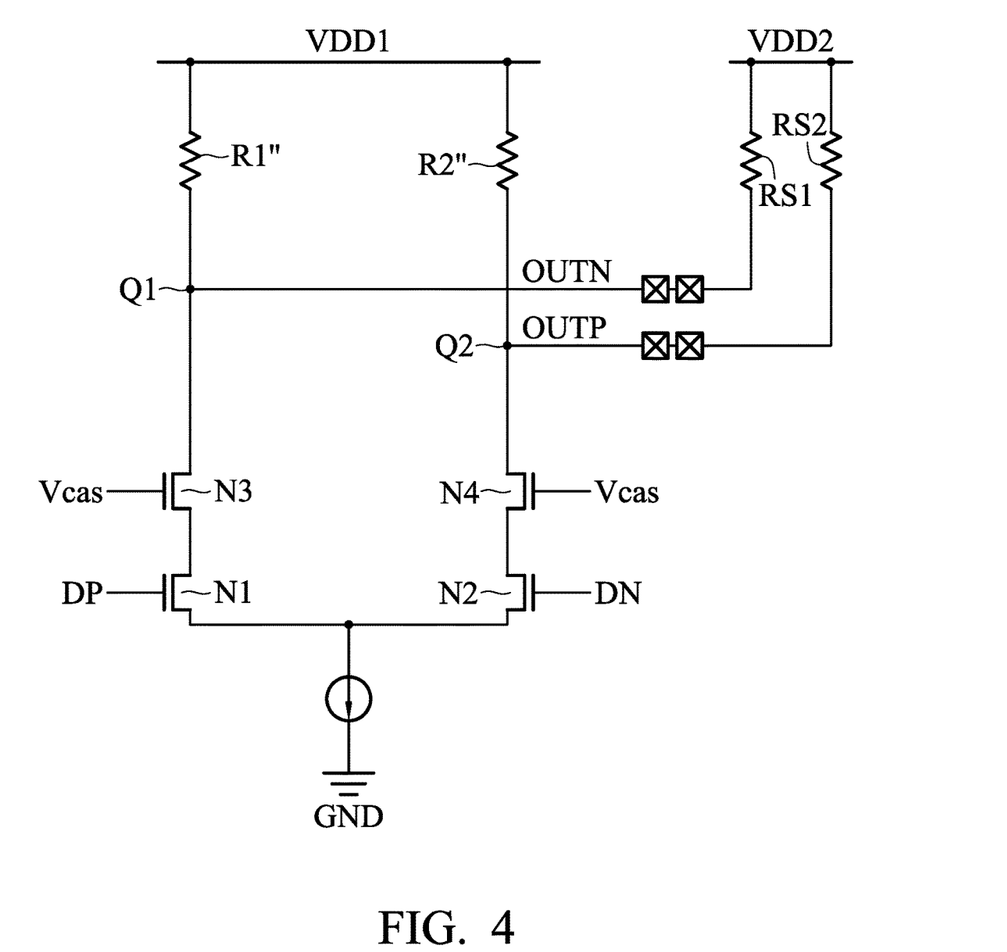
FIG. 4 is a schematic diagram showing an equivalent circuit when the transmitter module shown in FIG. 2 operates in a second operation mode.

Referring to FIG. 4, FIG. 4 is a schematic diagram showing an equivalent circuit when the transmitter module shown in FIG. 2 operates in the second operation mode. As shown in FIG. 4, the first pull-up resistor R1" and the second pull-up resistor R2" are the corresponding equivalent resistors of the output impedance circuit 21.

One terminal of the first pull-up resistor R1" and one terminal of the second pull-up resistor R2" are coupled to the first power source VDD1. The other terminal of the first pull-up resistor R1" and the other terminal of the second pull-up resistor R2" are coupled to the first common node Q1 and the second common node Q2 respectively.

When the transmitter module 20 operates in the second operation mode, if the resistance of the first input resistor RS1 is equal to the resistance of the second input resistor RS2 and the resistance of the first resistor R1 is equal to the resistance of the second resistor R2 (that is, the resistance of the first pull-up resistor R1" is equal to the resistance of the second pull-up resistor R2"), the common-mode voltage of the differential output signals OUTP and OUTN generated by the transmitter module 20 can be calculated using the following equations.

$$V''_H = \frac{R_{source} * AVDD_{sink} + R_{sink} * AVDD_{source}}{R_{sink} + R_{source}}$$

$$V''_L = \frac{R_{source} * AVDD_{sink} + R_{sink} * AVDD_{source} - I_{DRV} * R_{sink} * R_{source}}{R_{sink} + R_{source}}$$

$$V''_{CM} = 0.5 * (V_H + V_L)$$

Moreover, the current consumed by the transmitter module 20 is calculated using the following equations:

$$I''_{source} = \frac{AVDD_{source} - AVDD_{sink} + R_{sink} * I_{DRV}}{R_{sink} + R_{source}}$$

I"$_{source}$ source is the current consumed by the transmitter module in the second operation mode, $V'''_H$ is the high level of the differential output signals in the second operation mode, $V'''_L$ is the low level of the differential output signals in the second operation mode, $V'''_{CM}$ is the common-mode voltage of the differential output signals in the second operation mode, $AVDD_{source}$ is the voltage provided by the first power source VDD1, $AVDD_{source}$ is the voltage provided by the second power source VDD2, $R_{sin\_k}$ is the resistance of the first input resistor RS1, $I_{DRV}$ is the current value provided by the current source, and $R_{source}$ is the resistance of the first pull-up resistor R1" which is equal to 1/N of the resistance of the first resistor R1, wherein N is the number of output impedance sub-circuits.

For example, when $AVDD_{source}$=$AVDD_{sink}$=3.3V, $R_{source}$=$R_{sink}$=50 ohm, and $I_{DRV}$=20 mA, $V''_H$=3.3V, $V''_L$=2.8V, and $V''_{CM}$=3.05V;

$I''_{source}$=10 mA

In other words, during the period when the transmitter module 20 operates in the second operation mode, when the voltage provided by the first power source VDD1 and the voltage provided by the second power source VDD2 are 3.3V, the resistance of the first input resistor R1 and the resistance of the second resistor R are 50Ω, the resistance of the first pull-up resistor R1" and the resistance of the second pull-up resistor R" are 50Ω, and current value provided by the current source is 20 mA, then the high level of the differential output signals OUTP and OUTN is 3.3V, the low level thereof is 2.8V, the common-mode voltage thereof is 3.05V, and the current consumed by the transmitter module 20 is 10 mA.

When the first switches K1 of some output impedance sub-circuits 221 are turned on, the second switches K2 and the third switches K3 of the some output impedance sub-circuits 221 are turned off, the first switches K1 of the remaining output impedance sub-circuits 221 are turned off, and the second switches K2 and the third switches K3 of the remaining output impedance sub-circuits 221 are turned on, then the output resistor provided by the output impedance circuit 21 comprises floating resistors and pull-up resistors, and the transmitter module 20 operates in a third operation mode.

Figure 5:
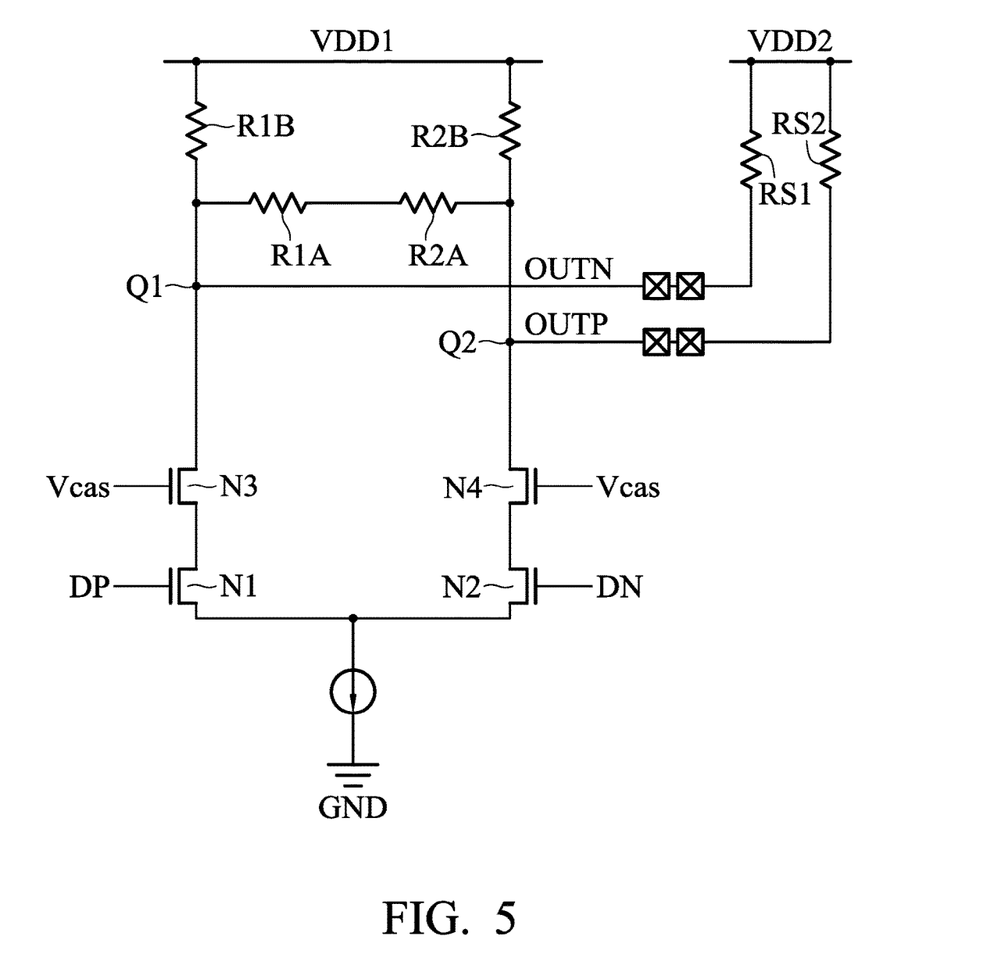
FIG. 5 is a schematic diagram showing an equivalent circuit when the transmitter module shown in FIG. 2 operates in a third operation mode.

Referring to FIG. 5, FIG. 5 is a schematic diagram showing an equivalent circuit when the transmitter module shown in FIG. 2 operates in the third operation mode. As shown in FIG. 5, the first floating resistor R1A, the second floating resistor R2A, the first pull-up resistor R1B, and the second pull-up resistor R2B are the corresponding equivalent resistors of the output impedance circuit 21.

One terminal of the first floating resistor R1A is coupled to one terminal of the second floating resistor R2A. The other terminal of the first floating resistor R1A and the other terminal of the second floating resistor R2A are coupled to the first common node Q1 and the second common node Q2 respectively.

One terminal of the first pull-up resistor R1B and one terminal of the second pull-up resistor R2B are coupled to the first power source VDD1. The other terminal of the first pull-up resistor R1B and the other terminal of the second pull-up resistor R2B are coupled to the first common node Q1 and the second common node Q2 respectively.

When the transmitter module 20 operates in the third operation mode, if the resistance of the first input resistor RS1 is equal to the resistance of the second input resistor RS2 and the resistance of the first resistor R1 is equal to the resistance of the second resistor R2 (that is, the resistance of the first floating resistor R1A and the second floating resistor R2A are equal to the resistance of the first pull-up resistor R1B and the second pull-up resistor R2B"), the high level, the low level, and the common-mode voltage of the differential output signals OUTP and OUTN generated by the transmitter module 20 and the consumed current meet the following relationships.

$$V_H = V'_H \sim V''_H$$

$$V_L = V'_L \sim V''_L$$

$$V_{CM} = 0.5 * (V_H + V_L)$$

$$I_{source} = 0 \sim I''_{source}$$

$I_{source}$ is the current consumed by the transmitter module in the third operation mode, $V_H$ is the high level of the differential output signals in the third operation mode, $V_L$ is the low level of the differential output signals in the third operation mode, and $V_{CM}$ is the common-mode voltage of the differential output signals in the third operation mode.

In other words, the current $I_{source}$ consumed by the transmitter module in the third operation mode is greater than the current $I'_{source}$ consumed in the first operation mode (that is 0) and less than the current $I''_{source}$ consumed in the second operation mode. The common-mode voltage $V_{CM}$ of the transmitter module in the third operation mode is higher than the common-mode voltage $V'_{CM}$ in the first operation mode and lower than the common-mode voltage $V''_{CM}$ in the third operation mode.

For example, during the period when the transmitter module 20 operates in the third operation mode, when the voltage provided by the first power source VDD1 and the voltage provided by the second power source VDD2 are 3.3V, the resistance of the first input resistor RS1 and the resistance of the second resistor RS2 are 50Ω, the sum of the resistance of the first floating resistor R1A and the resistance of the first pull-up resistor R1B is 50Ω, the sum of the resistance of the second floating resistor R2A and the resistance of the second pull-up resistor R2B is 50Ω, and current value provided by the current source is 20 mA, then the high level of the differential output signals OUTP and OUTN is 3.05V~3.3V, the low level thereof is 2.55V~2.8V, the common-mode voltage thereof is 2.8V~3.05V, and the current consumed by the transmitter module 20 is 0~10 mA.

According to the above description, in the first operation mode, the common-mode voltage of the transmitter module 20 is lowest, and the current consumed by the transmitter module 20 is the smallest; in the second operation mode, the common-mode voltage of the transmitter module 20 is highest, and the current consumed by the transmitter module 20 is largest; in the third operation mode, the common-mode voltage and the consumed current are between those of the first operation mode and those of the second operation mode, respectively.

In the embodiments above, the current-mode logic circuit allows the transmitter module to operate in three different operation modes by controlling the states of the first switches, the second switches, and the third switches in the output impedance sub-circuits, so that the common-mode voltage of the differential output signals transmitted by the transmitter module and the current consumed by the transmitter module can be adjusted in response to different operation modes. Thus, the current-mode logic circuit can be flexibly applied to various high-speed transmission applications.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A current-mode logic circuit comprising:
a transmitter module comprising:
an output impedance circuit providing an adjustable output resistor, wherein the adjustable output resistor comprises floating resistors and/or pull-up resistors;
a switch circuit, coupled to the output impedance circuit, receiving differential input signals, outputting differential output signals, and controlling high-low level switching of the differential input signals and the differential output signals according to the adjustable output resistor; and
a current source, coupled to the output impedance circuit and the switch circuit, providing currents to the output impedance circuit and the switch circuit,
wherein the floating resistors are resistors coupled between the differential output signals, and the pull-up resistors are resistors coupled between the differential output signals and a first power source,
wherein the output impedance circuit comprises a plurality of output impedance sub-circuits which are coupled in parallel,
wherein each of the plurality of output impedance sub-circuits comprises a first resistor, a second resistor, a first switch, a second switch, and a third switch,
wherein terminals of the first resistors on one side are coupled together at a first common terminal, and terminals of the second resistors on one side are coupled together at a second common terminal,
wherein for each output impedance sub-circuit, the other terminal of the first resistor is coupled to one terminal of the first switch and one terminal of the second switch, the other terminal of the first switch is coupled to the other terminal of the second resistor and one terminal of the third switch, and the other terminal of the second switch is coupled to the other terminal of the third switch and then coupled to the first power source, and
wherein the first common terminal and the second common terminal generate the differential output signals respectively.

2. The current-mode logic circuit as claimed in claim 1,
wherein the switch circuit comprises a first transistor and a second transistor, and
wherein gates of the first transistor and the second transistor receive differential input signals respectively, a drain of the first transistor and a drain of the second transistor are coupled to the first common node and the second common node respectively, and a source of the first transistor and a source of the second transistor are coupled together and then coupled to the current source.

3. The current-mode logic circuit as claimed in claim 2 further comprises a receiver module,
wherein the receiver module comprises an input impedance circuit, and the input impedance circuit comprises a first input resistor and a second input resistor, and
wherein one terminal of the first input resistor and one terminal of the second input resistor are coupled together and then coupled to a second power source, and the other terminal of the first input resistor and the other terminal of the second input resistor receives the differential output signals respectively.

4. The current-mode logic circuit as claimed in claim 3,
wherein when the first switch of each output impedance sub-circuit is turned on and the second switch and the third switch thereof are turned off, the adjustable output resistor comprises the floating resistors, and the transmitter module operates in a first operation mode,
wherein when the first switch of each output impedance sub-circuit is turned off and the second switch and the third switch thereof are turned on, the adjustable output resistor comprises pull-up resistors, and the transmitter module operates in a second operation mode, and
wherein when the first switches of some output impedance sub-circuits are turned on, the second switches and the third switches of the some output impedance sub-circuits are turned off, the first switches of the remaining output impedance sub-circuits are turned off, and the second switches and the third switches of the remaining output impedance sub-circuits are turned on, then the output resistor comprises floating resistors and pull-up resistors, and the transmitter module operates in a third operation mode.

5. The current-mode logic circuit as claimed in claim 4,
wherein a common-mode voltage of the differential output signals of the transmitter module operating in the first operation mode is a first common-mode voltage, a common-mode voltage of the differential output signals of the transmitter module operating in the second operation mode is a second common-mode voltage, and a common-mode voltage of the differential output signals of the transmitter module operating in the third operation mode is a third common-mode voltage, and
wherein the third common-mode voltage is higher than the first common-mode voltage, and the third common-mode voltage is lower than the second common-mode voltage.

6. The current-mode logic circuit as claimed in claim 5,
wherein when the transmitter module operates in the first operation mode, if resistance of the first input resistor is equal to resistance of the second input resistor and resistance of the first resistor is equal to resistance of the second resistor, the common-mode voltage of the differential output signals generated by the transmitter module is calculated using the following equations:

$$V_H = AVDD_{sink} - \frac{R_{sink}}{2R_{sink} + 2R_{source}} * I_{DRV} * R_{sink}$$

$$V_L = AVDD_{sink} - \frac{R_{sink}}{2R_{sink} + 2R_{source}} * I_{DRV} * R_{sink} - \frac{R_{sink}}{2R_{sink} + 2R_{source}} * I_{DRV} * 2R_{source}$$

$$V_{CM} = 0.5 * (V_H + V_L),$$

and
wherein $V_H$ is a high level of the differential output signals, $V_L$ is a low level of the differential output signals, $V_{CM}$ is the common-mode voltage of the differential output signals, $AVDD_{sin\ k}$ is a voltage provided by the second power source, $R_{sin\ k}$ is the resistance of the first input resistor, $I_{DRV}$ is a current value provided by the current source, and $R_{source}$ is resistance of the floating resistors which are equal to 1/N of the resistance of the first resistor, wherein N is the number of output impedance sub-circuits.

7. The current-mode logic circuit as claimed in claim 5,
wherein when the transmitter module operates in the second operation mode, if resistance of the first input resistor is equal to resistance of the second input resistor and resistance of the first resistor is equal to resistance of the second resistor, the common-mode voltage of the differential output signals generated by the transmitter module is calculated using the following equations:

$$V_H = \frac{R_{source} * AVDD_{sink} + R_{sink} * AVDD_{source}}{R_{sink} + R_{source}}$$

$$V_L = \frac{R_{source} * AVDD_{sink} + R_{sink} * AVDD_{source} - I_{DRV} * R_{sink} * R_{source}}{R_{sink} + R_{source}}$$

$$V_{CM} = 0.5 * (V_H + V_L)$$

and
wherein $V_H$ is a high level of the differential output signals, $V_L$ is a low level of the differential output signals, $V_{CM}$ is the common-mode voltage of the differential output signals, $AVDD_{source}$ is a voltage provided by the first power source, $AVDD_{sin\ k}$ is a voltage provided by the second power source, $R_{sin\ k}$ is the resistance of the first input resistor, $I_{DRV}$ is a current value provided by the current source, and $R_{source}$ is resistance of the pull-up resistors which are equal to 1/N of the resistance of the first resistor, wherein N is the number of output impedance sub-circuits.

8. The current-mode logic circuit as claimed in claim 4,
wherein a current consumed by the transmitter module operating in the first operation mode is a first consumed current, a current consumed by the transmitter module operating in the second operation mode is a second consumed current, and a current consumed by the transmitter module operating in the third operation mode is a third consumed current, and
wherein the third consumed current is greater than the first consumed current, and the third consumed current is less than the second consumed current.

9. The current-mode logic circuit as claimed in claim 8, wherein the transmitter module operates in the first operation mode, and the current consumed by the transmitter module is zero.

10. The current-mode logic circuit as claimed in claim 8, wherein when the transmitter module operates in the second operation mode, if resistance of the first input resistor is equal to resistance of the second input resistor and resistance of the first resistor is equal to resistance of the second resistor, the current consumed by the transmitter module can be found using the following equation:

$$I_{source} = \frac{AVDD_{source} - AVDD_{sink} + R_{sink} * I_{DRV}}{R_{sink} + R_{source}},$$

and
wherein $I_{source}$ is the current consumed by the transmitter module, $AVDD_{source}$ is a voltage provided by the first power source, $AVDD_{sin\,k}$ is a voltage provided by the second power source, $R_{sin\,k}$ is the resistance of the first input resistor, $I_{DRV}$ is a current value provided by the current source, and $R_{source}$ is resistance of the pull-up resistors which are equal to 1/N of the resistance of the first resistor, N is the number of output impedance sub-circuits.

11. The current-mode logic circuit as claimed in claim 3, wherein the transmitter module and the receiver module are disposed in different devices, and the transmitter module transmits the differential signals to the receiver module through a connection line.

12. The current-mode logic circuit as claimed in claim 2, wherein the transmitter module further comprises a protection circuit coupled between the output impedance circuit and the switch circuit, and
wherein the protection circuit comprises a third transistor and a fourth transistor, gates of the third transistor and the fourth transistor receive a control signal, sources of the third transistor and the fourth transistor are coupled to the drains of the first transistor and the second transistor respectively, and drains of the third transistor and the fourth transistor are coupled to the first common node and the second common node respectively.

* * * * *